United States Patent [19]
Higashi et al.

[11] Patent Number: 5,723,206
[45] Date of Patent: Mar. 3, 1998

[54] POLYIMIDE-METAL FOIL COMPOSITE FILM

[75] Inventors: Kazumi Higashi; Amane Mochizuki, both of Osaka, Japan

[73] Assignee: Nitto Denko Corporation, Osaka, Japan

[21] Appl. No.: 768,635

[22] Filed: Dec. 18, 1996

[30] Foreign Application Priority Data

Dec. 26, 1995 [JP] Japan .................. 7-339569

[51] Int. Cl.⁶ .................. B32B 7/02; B32B 15/08
[52] U.S. Cl. .................. 428/215; 428/334; 428/335; 428/337; 428/339; 428/458; 428/473.5
[58] Field of Search .................. 428/334, 335, 428/337, 338, 339, 458, 473.5, 213, 215

[56] References Cited

U.S. PATENT DOCUMENTS

| | | | |
|---|---|---|---|
| 4,916,009 | 4/1990 | Hino et al. | 428/220 |
| 4,937,133 | 6/1990 | Watanabe et al. | 428/209 |
| 5,601,905 | 2/1997 | Watanabe et al. | 428/215 |

FOREIGN PATENT DOCUMENTS

| | | | |
|---|---|---|---|
| 60-157286 | 8/1985 | Japan | H05K 1/02 |
| 60-243120 | 12/1985 | Japan | C08G 73/10 |

*Primary Examiner*—D. S. Nakarani
*Attorney, Agent, or Firm*—Sughrue, Mion, Zinn, Macpeak & Seas, PLLC

[57] ABSTRACT

A polyimide-metal foil composite film comprising a conductive metal foil having directly laminated on at least one surface thereof a polyimide resin layer which comprises repeating units represented by formulae (1) and (2) as described hereinabove. The polyimide-metal foil composite film can be used as a circuit substrate having excellent dimensional stability under high temperature.

5 Claims, No Drawings

POLYIMIDE-METAL FOIL COMPOSITE FILM

FIELD OF THE INVENTION

The present invention relates to a polyimide-metal foil composite film which is used as a circuit substrate having excellent dimensional stability under high temperature at the measurement and test to a fine material to be inspected, and in particular, a burn-in test.

BACKGROUND OF THE INVENTION

Recently, with small-sizing and thinning of an electronic instrument, a semiconductor device mounted thereon has been required to be more and more small-sized and also a mounting area of a semiconductor element has been required to be reduced as small as possible.

One of the means for meeting these requirements, which is practically employed, is a bare chip mounting wherein many semiconductor elements in the state that those are formed on a silicon wafer or the semiconductor elements in the state that those are cut into parts by dicing (hereinafter these semiconductors in the processing step are referred to as "bare chips"), are not packaged and are mounted on a substrate as they are. It is considered that hereafter the transfer to this mounting form will advance rapidly.

Further, in the future, mounting in the form of wafer as it is will be practiced. Accordingly, the various quality measurements and tests for semiconductor elements, and in particular, the burn-in test, which is carried out under a high-temperature condition being severe to semiconductor elements, must be carried out in the bare chip state or the wafer state which is the pre-stage to the bare chip state.

On the other hand, in the burn-in test, a measurement test is conducted by electric contact to subjects to be contacted, such as electrodes, conductive portions, etc., finely formed on a fine material to be inspected, such as a bare chip or a wafer. Therefore, it is general that the circuit is formed using a flexible substrate and the circuit is connected to a measurement instrument disposed at the outside.

However, at present the flexible substrate is generally formed by using copper as a conductive layer and a polyimide resin as an insulating layer. When high temperature is applied to the flexible substrate as in burn-in test, etc., a gap forms at the conductively connected portions by the difference between a linear expansion coefficient of silicon, which is the material for a semiconductor element, and a linear expansion coefficient of copper or the polyimide resin, which is the material for the flexible substrate, causing the problems that scratches form at the terminal portion of the material to be inspected and also the terminal is detached to make the conductive connection impossible.

To overcome this problem, it is an effective means to use a material for forming the conductive layer and a material for forming the insulating layer each having a linear expansion coefficient near the linear expansion coefficient of silicon as near as possible, thereby making small the difference in the dimensional change between silicon and both the conductive layer and insulating layer even at heating. Specifically, the material for forming the conductive layer is, for example, an iron-42 wt % nickel alloy (hereinafter referred to as "42 alloy"), which is used for mounting semiconductor elements, but a polyimide resin, which is used as the material for forming the insulating layer, having a small linear expansion coefficient as in the linear expansion coefficient of the 42 alloy has not yet been obtained at present. Further, when the linear expansion coefficient of the conductive layer differs from that of the insulating layer, the film is greatly curled when the composite film of both the layers is prepared. Thus, it becomes very difficult to practically use such a composite film.

SUMMARY OF THE INVENTION

The present invention has been made under such circumstances.

An object of the present invention to provide a polyimide-metal foil composite film which is used as a material for a flexible substrate, etc., having excellent dimensional stability even at heating.

According to the present invention, there is provided a polyimide-metal foil composite film comprising conductive metal foil having directly laminated on at least one surface thereof a polyimide resin layer, the polyimide resin layer comprising repeating units represented by the following formulae (1) and (2);

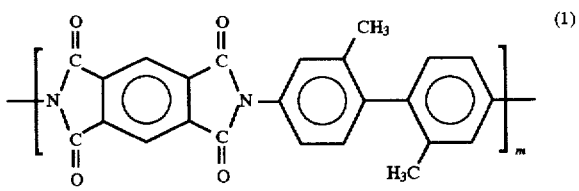

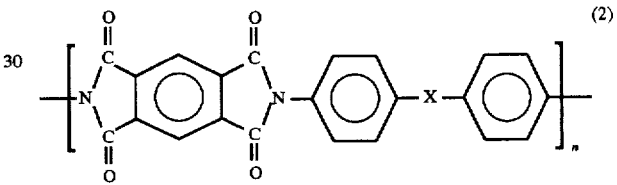

wherein X represents

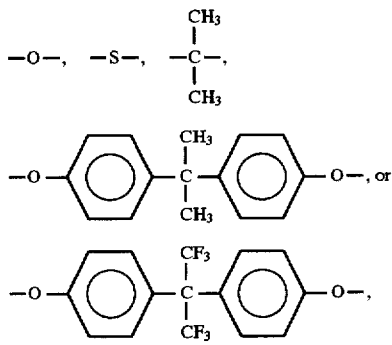

and m/n molar ratio is from 90/10 to 50/50.

The inventors made a series of investigations for obtaining a composite film comprising a conductive metal foil and a polyimide resin, the composite film having excellent dimensional stability even under high temperature in the burn-in test, etc., by preventing the occurrence of curling caused by the difference in the linear expansion coefficient between the conductive metal foil and the polyimide resin layer at heating. The inventors further made a series of investigations for obtaining a polyimide resin having a linear expansion coefficient lower than those of conventional polyimide resins and nearer, for example, the linear expansion coefficient of the 42 alloy forming the conductive metal foil, which is used for mounting a semiconductor element. As a result, it has been ascertained that when the polyimide resin comprising the repeating units represented by the above formulae (1) and (2) is used as the polyimide resin layer which is laminated on at least one surface of the conductive metal foil layer, the polyimide resin comprising the specific repeating units has a sufficient strength, and the linear expansion coefficient of the resin is lower than those of conventional polyimide resins and approximates to the linear expansion coefficient of the conductive metal foil. Accordingly, it has been found that the occurrence of curling is prevented by the approximation of the linear expansion coefficient of the polyimide resin layer to the linear expansion coefficient of the conductive metal foil and excellent dimensional stability can be imparted. The present invention has been attained based on this finding.

DETAILED DESCRIPTION OF THE INVENTION

The present invention is described in detail below.

The polyimide-metal foil composite film of the present invention has a structure that the polyimide resin layer is directly formed on at least one surface of a conductive metal foil.

A polyimide resin precursor for forming the polyimide resin layer is obtained by reacting organic tetracarboxylic acid dianhydrides and specific diamino compounds as starting raw materials in an organic polar solvent.

The organic tetracarboxylic acid dianhydride which can be used is pyromellitic dianhydride (PMDA).

To obtain the desired polyimide resin precursor in the present invention, two diamino compounds, i.e., m-tolidine and a diamino compound represented by the following formula (3), are used together as the specific diamino compound;

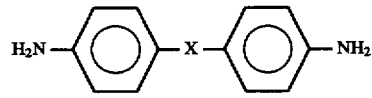

(3)

wherein X represents

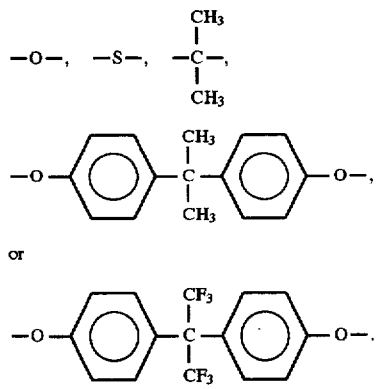

Of the diamino compounds represented by the formula (3), it is preferred to use 4,4'-diaminodiphenyl ether, 2,2-bis[4-(4-aminophenoxy)phenyl]propane, 4,4'-diaminodiphenyl thioether, 4,4'-diaminodiphenylpropane, and 2,2-bis[4-(4-aminophenoxy)phenyl]hexafluoropropane, considering a heat resistance of the desired polyimide resin.

The compounding ratio (Z/Y) of m-tolidine (Z) and the diamino compound (Y) represented by the formula (3) is in the range of from 90/10 to 50/50, and preferably from 85/15 to 60/40, by molar ratio. In the above compounding ratio of both components, if Z exceeds 90 mole %, the strength of the polyimide coating (polyimide resin layer) is decreased. On the other hand, if Z is less than 50 mole %, the linear expansion coefficient of the polyimide resin obtained becomes large and the substrate may curl.

When the molar ratio of m-tolidine and the diamino compound represented by the formula (3) is within the above-described range, 15 mole % or less in the amount of the diamino compounds used may be replaced with a diamino compound other than those diamino compounds, i.e., m-tolidine and the diamino compound represented by the formula (3).

Accordingly, in the present invention, the polyimide resin layer comprising the repeating units represented by the formulae (1) and (2) includes the following two embodiments;

[1] An embodiment that the whole polyimide resin layer comprises the repeating units represented by the formulae (1) and (2), and

[2] An embodiment that when a diamino compound other than m-tolidine and the diamino compound represented by the formula (3) is used as the diamino compounds, the content of the repeating units represented by the formulae (1) and (2) is at least 85 mole % of the whole polyimide resin layer and the rest is composed of the structural unit formed by the reaction with the other diamino compound.

Examples of the other diamino compounds include m-phenylenediamine, 2,4-diaminotoluene, p-phenylenediamine, 3,4'-diaminodiphenyl ether, 3,3'-diaminodiphenyl ether, 4,4'-diaminodiphenylmethane, 4,4'-diaminodiphenylsulfone, 3,3'-diaminodiphenylsulfone, 3,3'-diaminobenzophenone, 4,4'-diaminodiphenylhexafluoropropane, 1,4-bis(4-aminophenoxy)-benzene, 4,4'-bis(4-aminophenoxy)-biphenyl, 4,4'-bis(4-aminophenoxy)diphenylsulfone, and 4,4'-bis(3-aminophenoxy)-diphenylsulfone.

The other diamino compounds further include silicon diamines represented by the following chemical formulae (a) to (g).

$$H_2N+CH_2\overline{\rangle_3}\underset{\underset{CH_3}{|}}{\overset{\overset{CH_3}{|}}{Si}}-O-\underset{\underset{CH_3}{|}}{\overset{\overset{CH_3}{|}}{Si}}+CH_2\overline{\rangle_3}NH_2 \quad (a)$$

$$H_2N+CH_2\overline{\rangle_4}\underset{\underset{CH_3}{|}}{\overset{\overset{CH_3}{|}}{Si}}-O-\underset{\underset{CH_3}{|}}{\overset{\overset{CH_3}{|}}{Si}}+CH_2\overline{\rangle_4}NH_2 \quad (b)$$

$$H_2N+CH_2\overline{\rangle_3}\underset{\underset{C_6H_5}{|}}{\overset{\overset{C_6H_5}{|}}{Si}}-O-\underset{\underset{C_6H_5}{|}}{\overset{\overset{C_6H_5}{|}}{Si}}+CH_2\overline{\rangle_3}NH_2 \quad (c)$$

$$H_2N+CH_2\overline{\rangle_4}\underset{\underset{C_6H_5}{|}}{\overset{\overset{C_6H_5}{|}}{Si}}-O-\underset{\underset{C_6H_5}{|}}{\overset{\overset{C_6H_5}{|}}{Si}}+CH_2\overline{\rangle_4}NH_2 \quad (d)$$

(e)

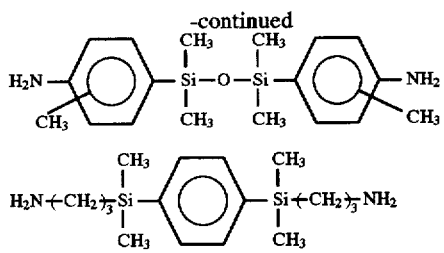

The synthesis of the polyimide resin precursor is carried out as follows. The tetracarboxylic acid dianhydride is reacted with an almost equimolar amount of the above-described diamino compounds in an organic polar solvent usually at a temperature of from 0° to 90° C. for from 1 to 24 hours to form the polyimide resin precursor such as polyamic acid.

Examples of the organic polar solvent are N-methyl-2-pyrrolidone (hereinafter referred to as "NMP"), N,N-dimethylacetamide, N,N-dimethylformamide, dimethyl sulfoxide, and dimethylphosphoramide. The polyimide resin precursor thus synthesized has an inherent viscosity (measured in N-methyl-2-pyrrolidone at a concentration of 0.5 g/10 ml at a temperature of 30° C.) of from 0.5 to 5.0, and preferably from 1.0 to 4.0. If the inherent viscosity of the polyimide resin precursor is less than 0.5, the mechanical strength of the polyimide resin obtained is undesirably greatly decreased, and if the inherent viscosity is larger than 5.0, the coating workability on the conductive metal foil is undesirably decreased.

The inherent viscosity used herein is calculated by the following equation, wherein a falling time is measured by a capillary viscometer.

$$\text{Inherent viscosity } \eta_{inh} = \ln(t_1/t_0)/C$$

wherein $t_1$ is time that a solution falls through a definite volume of a capillary, $t_0$ is time that a solvent of the solution falls through the same volume, and C is a concentration of a polymer in 100 ml of the solution, shown by gram.

It is known that the inherent viscosity has a direct relation with a molecular weight of the polymer.

The solution viscosity of the polyimide resin precursor solution at 30° C. is in the range of preferably from 10 to 2,000 Pa·s, and more preferably from 20 to 1,000 Pa·s. This is because by establishing the solution viscosity in the above-described range, the workability at coating by a coater, etc., is improved.

There is no particular restriction on the conductive metal foil used, and conventional conductive metal foils can be used. For example, an iron-nickel alloy, stainless steel, etc., are used. Preferred examples of the metal foil are an iron-42 wt % nickel alloy (42 alloy), an iron-45 wt % nickel alloy (45 alloy), and an iron-36 wt % nickel alloy (36 alloy). Of these, the 42 alloy is most suitable, considering the purpose of use of the polyimide-metal foil composite film of the present invention (a material for a flexible substrate, etc.). In addition, to improve the adhesive force of the conductive metal foil to the polyimide resin layer formed from the polyimide resin precursor, it is more preferred to apply a treatment such as a corona discharging treatment, a chromate treatment, or formation of a primer layer using a silane coupling agent or a relatively soft polyimide resin to the surface of the conductive metal foil.

The polyimide-metal foil composite film of the present invention can be produced by, for example, the following method using an organic polar solvent for the polyimide resin precursor obtained as described above. The organic polar solvent solution of the polyimide resin precursor is coated by casting on the conductive metal foil having a thickness of from 1 to 500 μm, and preferably from 5 to 50 μm, using a conventional means such as a roll coater or a comma coater. In this case, if the thickness of the conductive metal foil is less than 1 μm, coating process becomes undesirably difficult due to poor strength of the metal foil. On the other hand, if the thickness of the conductive metal foil is over 500 μm, the polyimide-metal foil composite film lacks the flexibility, and such a composite film is not suitable for use in electric circuit plates such as a flexible substrate.

The concentration of the polyimide resin precursor in the organic polar solvent solution is preferably from about 10 to 30% by weight. If the concentration is less than 10% by weight, the surface of the polyimide resin layer may be roughed, and if the concentration is over 30% by weight, the viscosity becomes too high to decrease the coating workability, which are undesirable in the present invention.

Immediately after coating the organic polar solvent solution, the coated layer is heat-treated to cause an imidation reaction to form a polyimide resin layer. The heat treatment is carried out by heat-drying at a temperature of from 100° to 230° C. for from about 30 minutes to 2 hours to remove the organic polar solvent and then heat-treating at a temperature of from 250° to 600° C. for from about 1 minute to 3 hours. The thickness of the polyimide resin layer is usually from 5 to 100 μm, and preferably from 10 to 50 μm.

Thus, the polyimide resin layer comprising the repeating units represented by the formulae (1) and (2) is formed on at least one surface of the conductive metal foil. The polyimide resin comprising the repeating units represented by the formulae (1) and (2) may be a block polymer, a random polymer, or an alternating copolymer. The ratio (m/n) of the repeating units represented by the formulae (1) and (2) must be in the range of from 90/10 to 50/50, and preferably in the range of from 85/15 to 60/40, by molar ratio. In the above ratio (molar ratio), if m of the repeating unit is over 90, the strength of the polyimide coating (polyimide resin layer) is greatly decreased, and if m of the repeating unit is less than 50, the linear expansion coefficient of the polyimide resin obtained becomes large, so that the composite film is curled.

In the polyimide resin layers each comprising the repeating units represented by the formulae (1) and (2), X in the formula (2) is preferably O— from the points of the heat resistance and the flexibility.

The polyimide-metal foil composite film of the present invention thus obtained has the excellent characteristic that curling, strain and the like do not substantially occur in both width direction and lengthwise (coating) direction. Further, since the polyimide resin has a very good dimensional stability, the polyimide resin can be suitably applied to the purposes of use such as a substrate for the burn-in test of semiconductor elements, to exhibit excellent effects.

The present invention is described in more detail by reference to the following examples and comparative examples, but it should be understood that the invention is not construed as being limited thereto.

EXAMPLE 1

In a 500 cc separable flask equipped with a stirrer and a thermometer were placed 17.0 g (0.08 mol) of m-tolidine (TLD), 4.0 g (0.02 mol) of 4,4'-diaminodiphenyl ether (DDE), and 172 g of N-methyl-2-pyrrolidone (NMP) followed by stirring to dissolve those diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 1.90 and a solution viscosity at 30° C. of 800 Pa·s.

The polyimide resin precursor solution obtained was diluted to 15% with NMP, and coated by casting on a 42 alloy foil having a thickness of 20 μm using an applicator. The coated layer was heated at 100° C. for 30 minutes, at 200° C. for 30 minutes, and then at 400° C. for 1 hour, in a nitrogen gas atmosphere to obtain a polyimide-metal foil composite film having a total thickness of 40 μm. The polyimide resin was composed of the two repeating units represented by the following formula (4) and m/n was 80/20 (molar ratio).

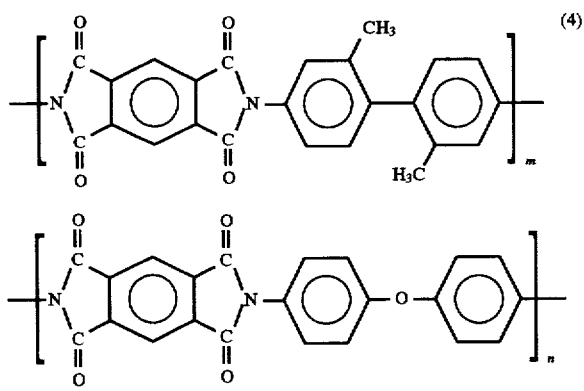

EXAMPLE 2

In a 500 cc separable flask equipped with a stirrer and a thermometer were placed 18.0 g (0.085 mol) of m-tolidine (TLD), 6.2 g (0.015 mol) of 2,2-bis[4-(4-aminophenoxy)-phenyl]propane, and 18.4 g of N-methyl-2-pyrrolidone (NMP) followed by stirring to dissolve the diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 2.05 and a solution viscosity at 30° C. of 950 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 40 μm. The polyimide resin was composed of the two repeating units represented by the following formula (5) and m/n was 85/15 (molar ratio).

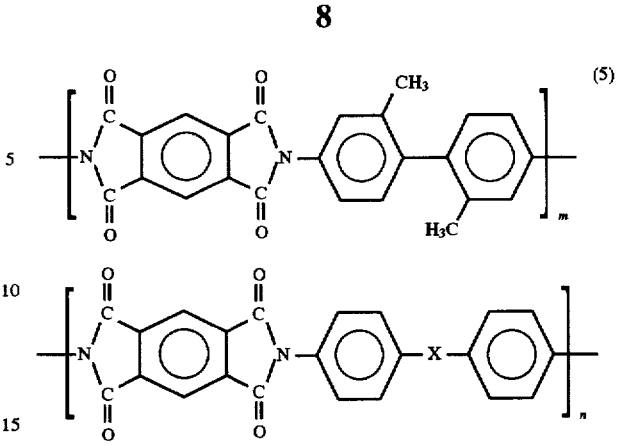

wherein X is

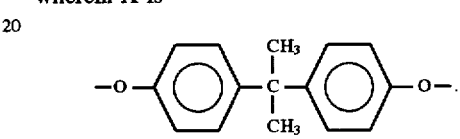

EXAMPLE 3

In a 500 cc separable flask equipped with a stirrer and a thermometer were placed 19.1 g (0.09 mol) of m-tolidine (TLD), 5.2 g (0.01 mol) of 2,2-bis[4-(4-aminophenoxy)-phenyl]hexafluoropropane, and 184.4 g of N-methyl-2-pyrrolidone (NMP) followed by stirring to dissolve the diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 1.85 and a solution viscosity at 30° C. of 840 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for one hour in a nitrogen gas atmosphere to obtain a polyimide-metal foil composite film having a total thickness of 50 μm. The polyimide resin was composed of the two repeating units represented by the following formula (6) and m/n was 90/10 (molar ratio).

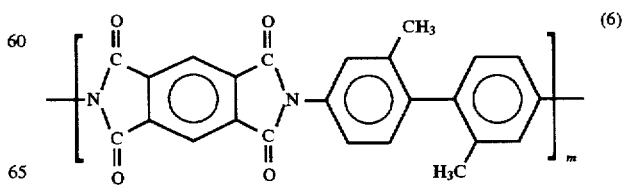

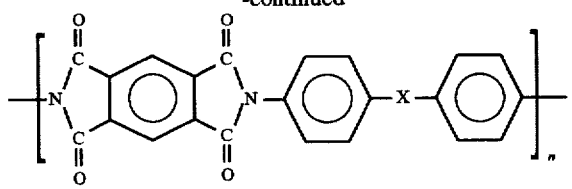

wherein X is

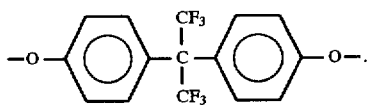

EXAMPLE 4

In a 500 cc separable flask equipped with a stirrer and a thermometer were placed 10.6 g (0.05 mol) of m-tolidine (TLD), 10.0 g (0.05 mol) of 4,4'-diaminodiphenyl ether, and 168.8 g of N-methyl-2-pyrrolidone (NMP) followed by stirring to dissolve the diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 1.80 and a solution viscosity at 30° C. of 720 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 55 μm. The polyimide resin was composed of the two repeating units represented by the following formula (7) and m/n was 50/50 (molar ratio).

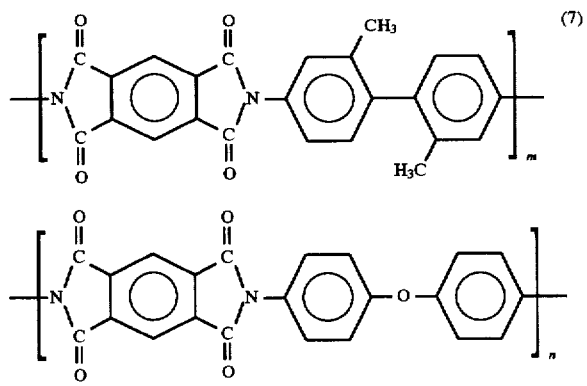

COMPARATIVE EXAMPLE 1

In a 500 cc separable flask equipped with a stirrer and a thermometer were placed 21.2 g (0.1 mol) of m-tolidine (TLD) and 172 g of N-methyl-2-pyrrolidone (NMP) followed by stirring to dissolve the diamino compound.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 1.85 and a solution viscosity at 30° C. of 750 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 45 μm. The polyimide-metal foil composite film was largely curled with the 42 alloy foil side being inside and thus was not a level of being used as a circuit substrate.

COMPARATIVE EXAMPLE 2

In a 500 cc separable flask equipped with a stirrer and a thermometer were placed 20 g (0.1 mol) of 4,4'-diaminodiphenyl ether (DDE) and 168 g of N-methyl-2-pyrrolidone (NMP) followed by stirring to dissolve the diamino compound.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 2.20 and a solution viscosity at 30° C. of 1,000 Pa·s.

The polyimide resin precursor solution obtained was diluted to 15% with NMP, and coated by casting on a 42 alloy foil having a thickness of 15 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 40 μm. The polyimide-metal foil composite film was largely curled with the polyimide layer side being inside and thus was not a level of being used as a circuit substrate.

COMPARATIVE EXAMPLE 3

In a 500 cc separable flask equipped with a stirrer and a thermometer were placed 20.1 g (0.095 mol) of m-tolidine (TLD), 2.1 g (0.005 mol) of 2,2-bis[4-(4-aminophenoxy)-phenyl]propane, and 175.2 g of N-methyl-2-pyrrolidone (NMP) followed by stirring to dissolve the diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 1.85 and a solution viscosity at 30° C. of 830 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 60 μm. The polyimide resin was composed of the two repeating units represented by the following formula (8) and m/n was 95/5 (molar ratio).

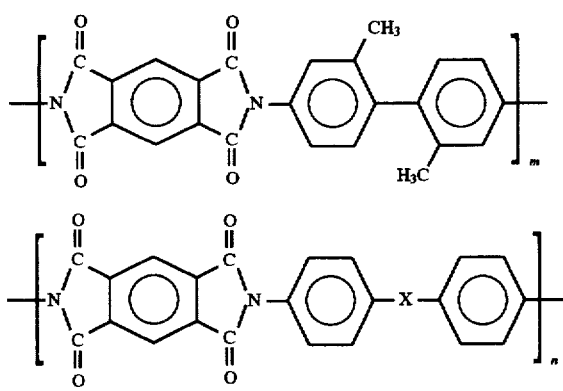

(8)

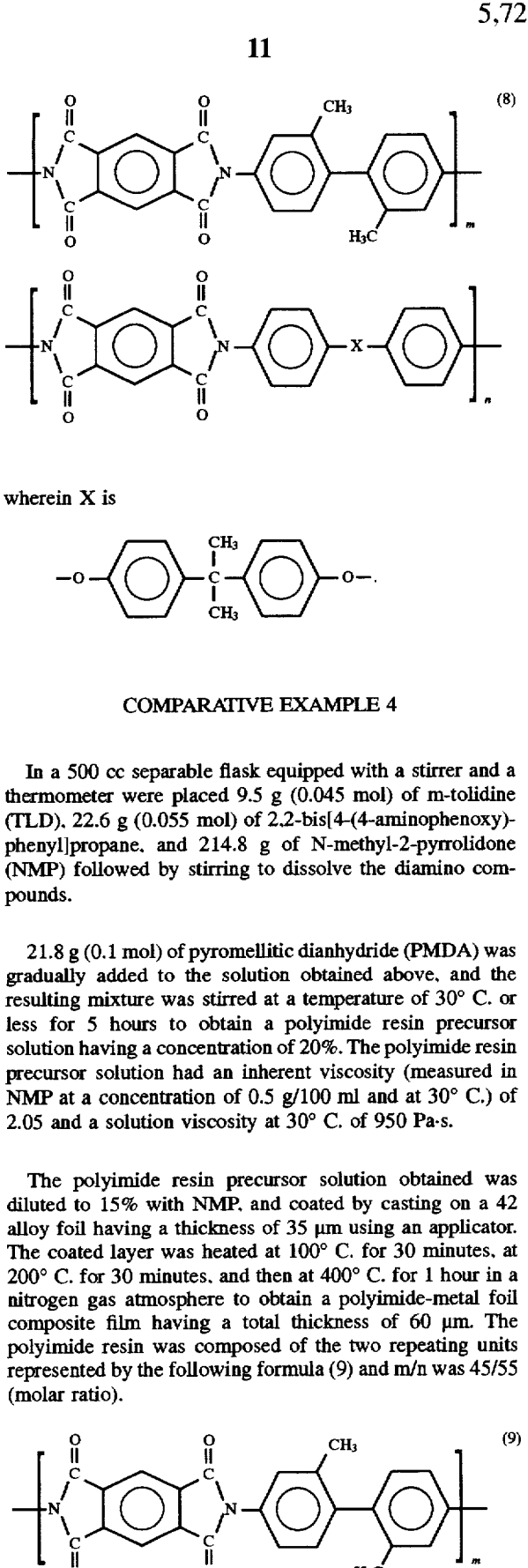

wherein X is

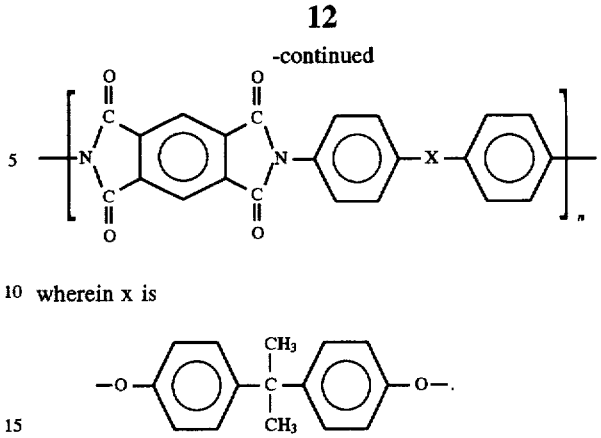

wherein x is

On each of the polyimide-metal foil composite films obtained in the examples and the comparative examples, the presence and absence of the occurrences of curling, a warp, etc., were visually confirmed and evaluated.

Further, a dimensional stability of each polyimide-metal foil composite film after allowing the composite film to stand at 300° C. for 1 hour was calculated by the following equation and a dimensional stability of each polyimide-metal foil composite film was evaluated.

Dimensional stability (%)=(A−B)/A

A: The dimension of initial composite film (10 cm)
B: The dimension of the composite film after allowing it to stand at 300° C. for 1 hour.

The results obtained are shown in the Table below.

COMPARATIVE EXAMPLE 4

In a 500 cc separable flask equipped with a stirrer and a thermometer were placed 9.5 g (0.045 mol) of m-tolidine (TLD), 22.6 g (0.055 mol) of 2,2-bis[4-(4-aminophenoxy)-phenyl]propane, and 214.8 g of N-methyl-2-pyrrolidone (NMP) followed by stirring to dissolve the diamino compounds.

21.8 g (0.1 mol) of pyromellitic dianhydride (PMDA) was gradually added to the solution obtained above, and the resulting mixture was stirred at a temperature of 30° C. or less for 5 hours to obtain a polyimide resin precursor solution having a concentration of 20%. The polyimide resin precursor solution had an inherent viscosity (measured in NMP at a concentration of 0.5 g/100 ml and at 30° C.) of 2.05 and a solution viscosity at 30° C. of 950 Pa·s.

The polyimide resin precursor solution obtained was diluted to 15% with NMP, and coated by casting on a 42 alloy foil having a thickness of 35 μm using an applicator. The coated layer was heated at 100° C. for 30 minutes, at 200° C. for 30 minutes, and then at 400° C. for 1 hour in a nitrogen gas atmosphere to obtain a polyimide-metal foil composite film having a total thickness of 60 μm. The polyimide resin was composed of the two repeating units represented by the following formula (9) and m/n was 45/55 (molar ratio).

(9)

TABLE 1

| | Occurrence of Curling | Dimensional Stability (%) |
|---|---|---|
| Example 1 | None | <0.01 |
| Example 2 | None | <0.01 |
| Example 3 | None | <0.01 |
| Example 4 | None | <0.01 |
| Comparative Example 1 | Curling occurred *1 | Measurement impossible |
| Comparative Example 2 | Curling occurred *2 | Measurement impossible |
| Comparative Example 3 | Crack formed in polyimide resin | Measurement impossible |
| Comparative Example 4 | Curling occurred *2 | Measurement impossible |

*1: Curling occurred largely with the 42 alloy side being inside.
*2: Curling occurred largely with the polyimide resin side being inside.

As shown in the Table above, the polyimide-metal foil composite films obtained in Comparative Examples 1, 2, and 4 showed that curling occurred largely with the 42 alloy side being inside (Comparative Example 1) and curling occurred with the polyimide resin side being inside (Comparative Examples 2 and 4). Thus, those composite films were not a level usable as a circuit substrate. Accordingly, the dimensional stability could not be measured on these samples. Further, the polyimide-metal foil composite film obtained in Comparative Example 3 showed that the polyimide resin obtained lacked the flexibility and the composite film could not practically be used from the point of strength.

On the other hand, the polyimide-metal foil composite films obtained in all the examples of the present invention caused neither curling nor wrap and were excellent in the dimensional stability such that the dimensional stability was less than 0.01%.

As described above, the polyimide-metal foil composite film of the present invention is the composite film wherein the polyimide resin layer comprising the repeating units represented by the formulae (1) and (2) described above is directly formed on the surface of a conductive metal foil layer. Accordingly, the linear expansion coefficient of the polyimide resin layer is far lower than those of conventional polyimide resin layers, and approximates to the linear expansion coefficient of the conductive metal foil, whereby the occurrence of excessive curling by the difference of the linear expansion coefficient at heating is prevented. Further, the composite film has an excellent dimensional stability. Therefore, the polyimide-metal foil composite film of the present invention can suitably be applied to the purposes of use such as the material of, for example, a flexible substrate for the burn-in test of a semiconductor element of bare chip.

While the invention has been described in detail and with reference to specific embodiments thereof, it will be apparent to one skilled in the art that various changes and modifications can be made therein without departing from the spirit and scope thereof.

What is claimed is:

1. A polyimide-metal foil composite film comprising a conductive iron-nickel alloy foil of 1–500 microns thickness having directly laminated on at least one surface thereof a polyimide resin layer, wherein said polyimide resin layer comprises repeating units represented by the following formulae (1) and (2);

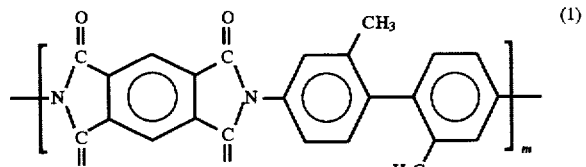 (1)

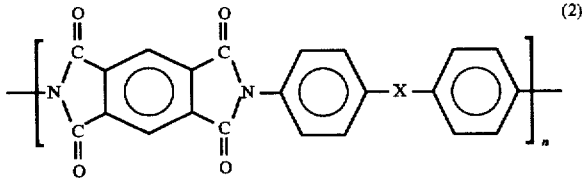 (2)

wherein X represents

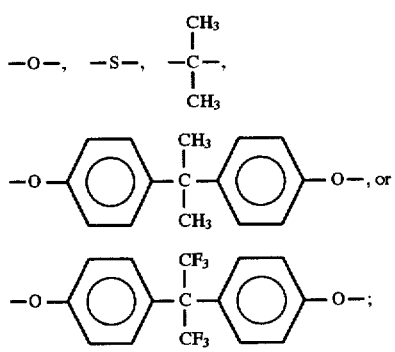

and m/n is from 90/10 to 50/50 by molar ratio.

2. The polyimide-metal foil composite film of claim 1, wherein the conductive metal foil has a thickness of from 5 to 50 μm.

3. The polyimide-metal foil composite film of claim 1, wherein the polyimide resin layer has a thickness of from 5 to 100 μm.

4. The polyimide-metal foil composite film of claim 1, wherein the polyimide resin layer has a thickness of from 10 to 50 μm.

5. The polyimide-metal foil composite film of claim 1, wherein the conductive iron-nickel alloy foil is selected from the group consisting of an iron-42 wt % nickel alloy foil, an iron-45 wt % nickel alloy foil, and an iron-36 wt % nickel alloy foil.

* * * * *